(12) United States Patent
Xiao et al.

(10) Patent No.: US 12,080,806 B2  
(45) Date of Patent: Sep. 3, 2024

(54) FAST RECOVERY DIODE AND MANUFACTURING METHOD THEREOF

(71) Applicant: BYD SEMICONDUCTOR COMPANY LIMITED, Shenzhen (CN)

(72) Inventors: Xiuguang Xiao, Shenzhen (CN); Wei Zhang, Shenzhen (CN)

(73) Assignee: BYD SEMICONDUCTOR COMPANY LIMITED, Shenzhen (CN)

( * ) Notice: Subject to any disclaimer, the term of this patent is extended or adjusted under 35 U.S.C. 154(b) by 266 days.

(21) Appl. No.: 17/296,045

(22) PCT Filed: Nov. 15, 2019

(86) PCT No.: PCT/CN2019/118786  
§ 371 (c)(1),  
(2) Date: Nov. 12, 2021

(87) PCT Pub. No.: WO2020/103770  
PCT Pub. Date: May 28, 2020

(65) Prior Publication Data  
US 2022/0059707 A1    Feb. 24, 2022

(30) Foreign Application Priority Data  
Nov. 21, 2018  (CN) .......................... 201811388533.6

(51) Int. Cl.  
*H01L 29/00* (2006.01)  
*H01L 29/66* (2006.01)  
*H01L 29/861* (2006.01)

(52) U.S. Cl.  
CPC .... *H01L 29/8611* (2013.01); *H01L 29/66136* (2013.01)

(58) Field of Classification Search  
CPC ............... H01L 29/861; H01L 29/8611; H01L 29/66128; H01L 29/66136; H01L 29/0615; H01L 29/0619  
See application file for complete search history.

(56) References Cited

U.S. PATENT DOCUMENTS

2003/0122151 A1    7/2003    Mauder et al.

FOREIGN PATENT DOCUMENTS

CN    102891173 A    1/2013  
CN    205177857 U    4/2016  
(Continued)

OTHER PUBLICATIONS

"Region, n., sense II.6.a". Oxford English Dictionary, Oxford University Press, Jul. 2023, <https://doi.org/10.1093/OED/3024956908> (Year: 2023).*

(Continued)

*Primary Examiner* — Reema Patel  
(74) *Attorney, Agent, or Firm* — Wenye Tan

(57) ABSTRACT

A fast recovery diode includes a cell region, a main junction region arranged around the cell region, and a termination region arranged around the main junction region. A main junction doping region in the main junction region has a doping concentration lower than that of an active region in the cell region. The doping concentration of the main junction doping region gradually decreases along a direction from inside to outside.

10 Claims, 8 Drawing Sheets

(56) References Cited

FOREIGN PATENT DOCUMENTS

| CN | 105826399 A | * | 8/2016 | |
|---|---|---|---|---|
| CN | 106298512 A | * | 1/2017 | ......... H01L 29/0684 |
| CN | 106601826 A | | 4/2017 | |
| CN | 106611777 A | | 5/2017 | |
| CN | 108493108 A | | 9/2018 | |
| DE | 102004007196 A1 | | 6/2005 | |

OTHER PUBLICATIONS

Stengl R et al: "Variation of Lateral Doping—A New Concept To Avoid High Voltage Breakdown of Planar Junctions", International Electron Devices Meeting. Washington, Dec. 1-4, 1985; [International Electron Devices Meeting], Washington, IEEE, US, Dec. 1985, pp. 154-157, XP002013050.
The World Intellectual Property Organization (WIPO) International Search Report for PCT/CN2019/118786 Feb. 6, 2020 6 Pages.

* cited by examiner

FAST RECOVERY DIODE AND MANUFACTURING METHOD THEREOF

This application is a national phase entry under 35 U.S.C. § 371 of International Application No. PCT/CN2019/118786, filed on Nov. 15, 2019, which claims priority to Chinese Patent Application No 201811388533.6 filed by the BYD Co., Ltd. on Nov. 21, 2018, and entitled FAST RECOVERY DIODE AND MANUFACTURING METHOD THEREOF, the entire contents of all of which are incorporated herein by reference in their entirety.

FIELD

The present disclosure relates to the technical field of semiconductors, in particular, to a fast recovery diode and a manufacturing method thereof.

BACKGROUND

Fast recovery diodes are widely applied to power electronic circuits such as switching power supplies and frequency converters due to the advantages of good switching characteristics, and short reverse recovery time, etc., and can meet application requirements including high voltage, heavy current, and high frequency, etc. As the application current increases, the failure of application ends caused by current crowding effects of fast recovery diodes can become more severe. Currently, the common practice is to add wider main junction regions at cell edges of fast recovery diodes. However, this design still has a high failure rate.

Therefore, the current related technology for fast recovery diodes needs to be improved.

SUMMARY

Some embodiments are directed to solving, at least to some extent, one of the technical problems in the related field. To this end, it is an objective of some embodiments to provide a fast recovery diode having the advantage of a weak current crowding effect or a low failure rate.

In one aspect, a fast recovery diode is provided. According to some embodiments, the fast recovery diode includes: a cell region, a main junction region arranged around the cell region, and a termination region arranged around the main junction region. A main junction doping region in the main junction region has a doping concentration lower than that of an active region in the cell region. The doping concentration of the main junction doping region gradually decreases along a direction from inside to outside. The inventors have found that by setting the doping concentration of the main junction doping region to be less than the doping concentration of the active region in the cell region, the concentration of the main junction doping region gradually decreases from inside to outside. Excess carriers injected into the main junction region during conduction are lower than those injected into the cell region, and the current density of the main junction region during reverse recovery is lower than that of the cell region, so that the current crowding effect of the fast recovery diode is improved, and the robustness of the fast recovery diode is improved.

In another aspect, a method for manufacturing the fast recovery diode described previously is provided. According to some embodiments, the method includes: forming an epitaxial layer on an upper surface of a substrate; forming a field oxide layer located in a termination region on an upper surface of the epitaxial layer; and doping the epitaxial layer which is not covered by the field oxide layer to form an active region located in a cell region and a main junction doping region located in a main junction region. Therefore, the manufacturing process is simple and easy to operate. Neither new photomask for forming a gradient doping region, nor any further process cost is needed.

DETAILED DESCRIPTION

Embodiments are described in detail below. The following described embodiments are illustrative only for explaining the present disclosure, and are not to be construed as limiting the present disclosure. Where specific technologies or conditions are not indicated in some embodiments, they are carried out according to technologies or conditions described in the literature in the art or according to the product specifications. The reagents or instruments used do not indicate the manufacturer and are conventional products commercially available.

One aspect of the present disclosure provides a fast recovery diode. According to some embodiments, referring to FIG. 1, the fast recovery diode includes: a cell region 10, a main junction region 20 arranged around the cell region, and a termination region 30 arranged around the main junction region. A main junction doping region in the main junction region 20 has a doping concentration lower than a doping concentration of an active region in the cell region 10. The doping concentration of the main junction doping region gradually decreases along a direction from inside to outside. The inventors have found that by setting the doping concentration of the main junction doping region to be less than the doping concentration of the active region in the cell region, the concentration of the main junction doping region gradually decreases from inside to outside, and excess carriers injected into the main junction region during conduction are lower than those injected into the cell region, and the current density of the main junction region during reverse recovery is lower than that of the cell region, so that the current crowding effect of the fast recovery diode is improved, and the robustness of the fast recovery diode is improved.

It is to be noted that the description mode "main junction doping region" as used herein is obtained by doping an epitaxial layer located in the main junction region, and extends into the epitaxial layer from an upper surface of the epitaxial layer in the fast recovery diode.

Figure 2:
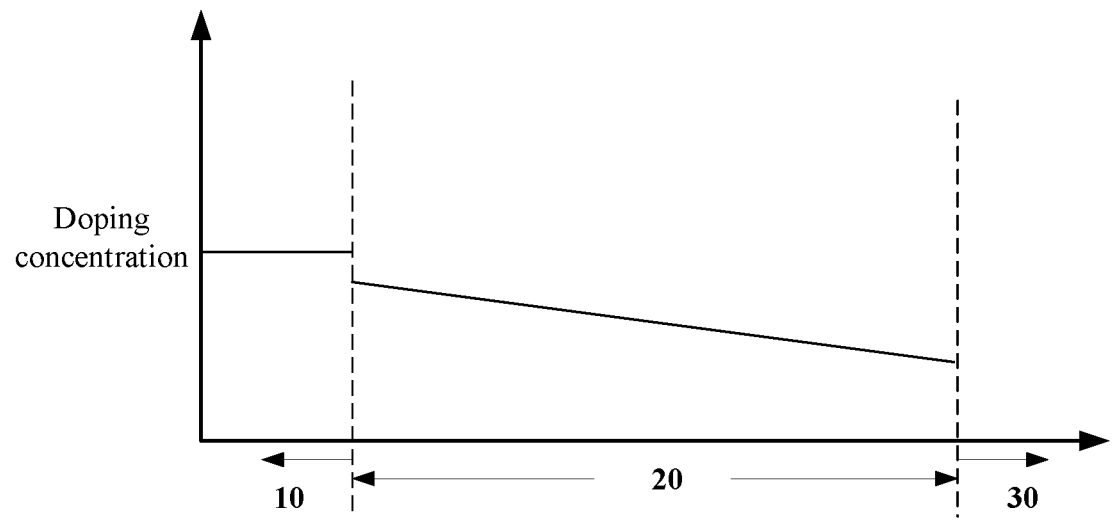
FIG. 2 is a schematic diagram of a doping concentration in a section by cutting along a line F-F' in FIG. 1 according to some other embodiments.
Figure 3:
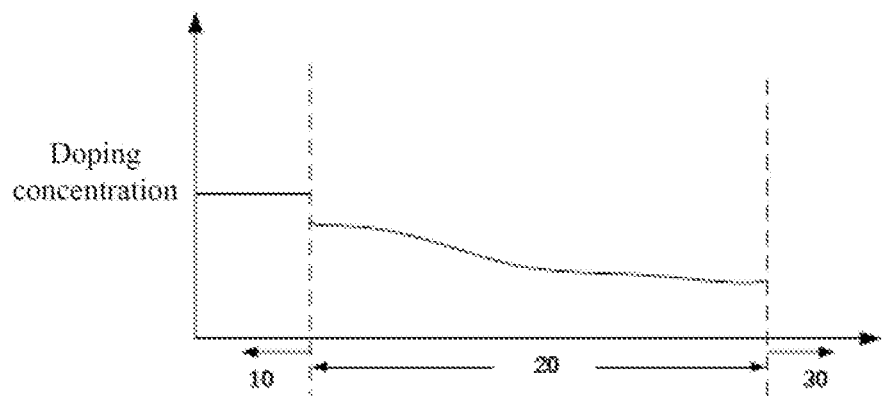
FIG. 3 is a schematic diagram of a doping concentration in a section by cutting of the line F-F' in FIG. 1 according to some other embodiments.

According to some embodiments, in order to further improve the current crowding effect of the fast recovery diode, the doping concentration of the main junction doping region decreases linearly (as shown in FIG. 2) or decreases non-linearly (as shown in FIG. 3) along a direction from inside to outside. Therefore, in the main junction doping region, the doping concentration decreases gradually along a direction away from the cell region, and the charge injection efficiency of the main junction region is reduced. As such, the electric field intensity decreases gradually from inside to outside, and the current decreases gradually, so that the current crowding effect is further reduced, the edge failure probability when an application client device is turned off is reduced, the size of the main junction region of the fast recovery diode is greatly reduced, the chip size and cost are further reduced, the sizes of a packaging module and an application system can be reduced, and the cost can be further reduced. It is to be noted that the direction from inside to outside refers to a direction from the cell region to the termination region.

Figure 4:
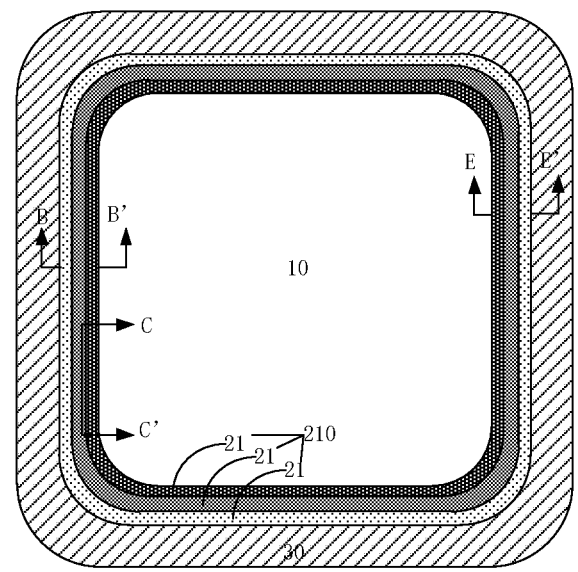
FIG. 4 is a schematic planar structure diagram of a fast recovery diode according to some other embodiments.
Figure 5:
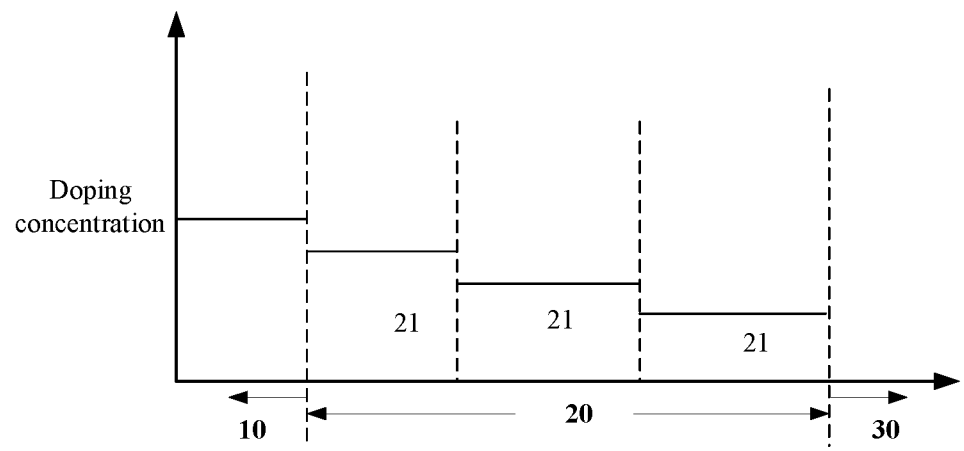
FIG. 5 is a schematic diagram of a doping concentration in a section by cutting of a line E-E' in FIG. 4 according to some other embodiments.
Figure 6:
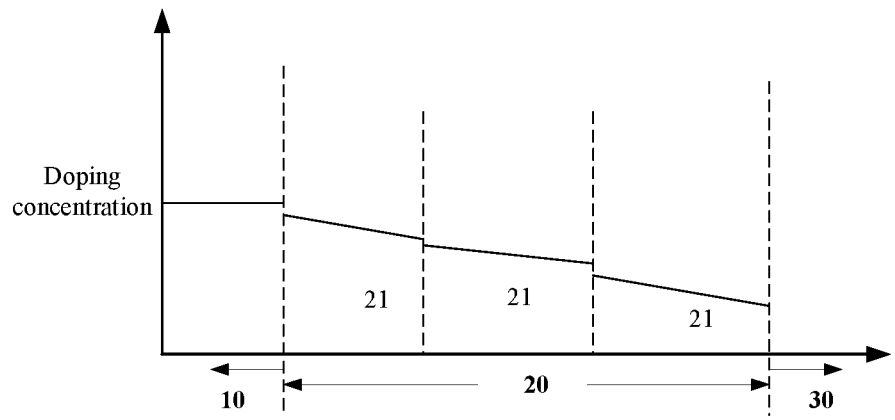
FIG. 6 is a schematic diagram of a doping concentration in a section by cutting of the line E-E' in FIG. 4 according to some other embodiments.
Figure 7:
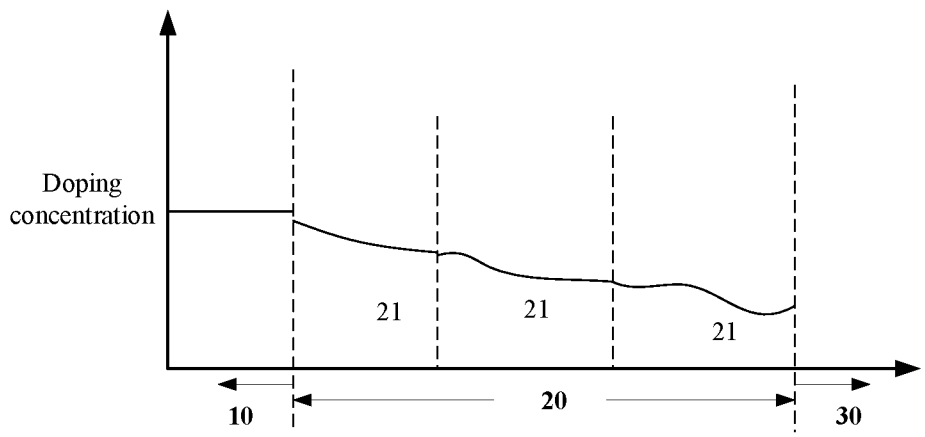
FIG. 7 is a schematic diagram of a doping concentration in a section by cutting of a line E-E' in FIG. 4 according to some other embodiments.

According to some embodiments, in order to obtain a better current crowding effect and to facilitate manufacturing and cost reduction, referring to FIG. 4, the main junction doping region 210 includes at least two gradient doping regions 21 sequentially arranged from inside to outside, and the highest doping concentration of the plurality of the gradient doping regions 21 gradually decreases along a direction from inside to outside. According to some specific embodiments, the doping concentration of each gradient doping region is equal (as shown in FIG. 5), decreases linearly (as shown in FIG. 6) or decreases non-linearly (as shown in FIG. 7). Therefore, a plurality of gradient doping regions with the highest doping concentration decreasing gradually are arranged in the main junction doping region. As such, the doping concentration decreases gradually along a direction away from the cell region, the charge injection efficiency of the main junction region is reduced, the electric field intensity decreases gradually from inside to outside, and the current decreases gradually, so that the current crowding effect is further reduced, and the edge failure probability when an application client device is turned off is reduced.

Figure 8:
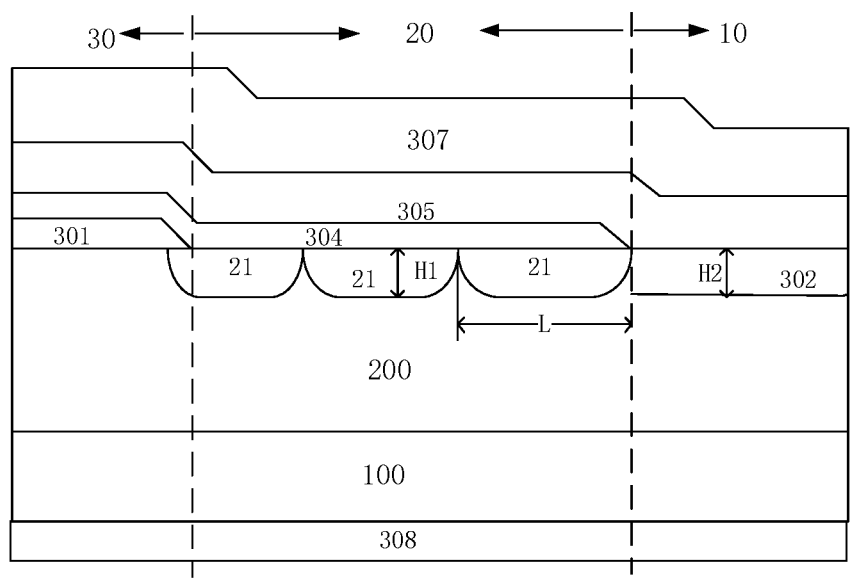
FIG. 8 is a schematic sectional structure diagram of line B-B' in FIG. 4.

According to some embodiments, in order to obtain a better effect of improving the current crowding effect and avoiding oversize of the fast recovery diode, in some embodiments, referring to FIG. 8, each of the gradient doping regions has a width L of 2 to 500 μm, e.g., 2 μm, 10 μm, 50 μm, 100 μm, 150 μm, 200 μm, 250 μm, 300 μm, 350 μm, 400 μm, 450 μm, or 500 μm. In some other embodiments, each of the gradient doping regions has a width of 2 to 300 μm. In some other embodiments, each of the gradient doping regions has a width of 10 to 200 μm, e.g., 10 μm, 20 μm, 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, or 200 μm. It is to be noted that the widths of the plurality of gradient doping regions in the main junction region may be the same or different. For example, the situation may include, but not limited to, that the width L of each gradient doping region is the same, and the widths of the plurality of gradient doping regions gradually decrease along a direction from inside to outside. Those skilled in the art would be able to flexibly select according to practical requirements. According to some embodiments, there are at least two gradient doping regions, so that the doping concentration effectively trends to gradually decrease, the edge current density is further reduced, and the current crowding effect of the fast recovery diode is further effectively improved.

According to some embodiments, there are 2 to 25 gradient doping regions, e.g., 2, 3, 4, 5, 6, 7, 8, 9, 10, 11, 12, 13, 14, 15, 16, 17, 18, 19, 20, 21, 22, 23, 24 or 25. Therefore, the doping concentration of the main junction doping region trends to gradually decrease from inside to outside, so that the main junction doping region forms a continuous doping region with gradually changing doping concentration, the charge injection efficiency of the main junction region can be further reduced, the effect of improving the current crowding effect can be improved, and the failure rate when an application client device is turned off can be reduced. Meanwhile, the width of the main junction region is not too large, the size of the fast recovery diode is favorably reduced, and the cost is reduced.

According to some embodiments, the width of the main junction region is 20 to 1000 μm (e.g., 20 μm, 50 μm, 100 μm, 150 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1000 μm). Therefore, the width of the main junction region is small, the chip size can be effectively reduced, and the product cost can be further reduced.

According to some embodiments, referring to FIG. 8, a junction depth H1 of the plurality of gradient doping regions in the fast recovery diode may be equal to a junction depth H2 of the active region in the cell region. Therefore, the usability of the fast recovery diode is favorably improved, the gradient doping region and the active region can be manufactured by doping once, an additional photomask does not need to be added, and the manufacturing cost is not increased.

Figure 1:
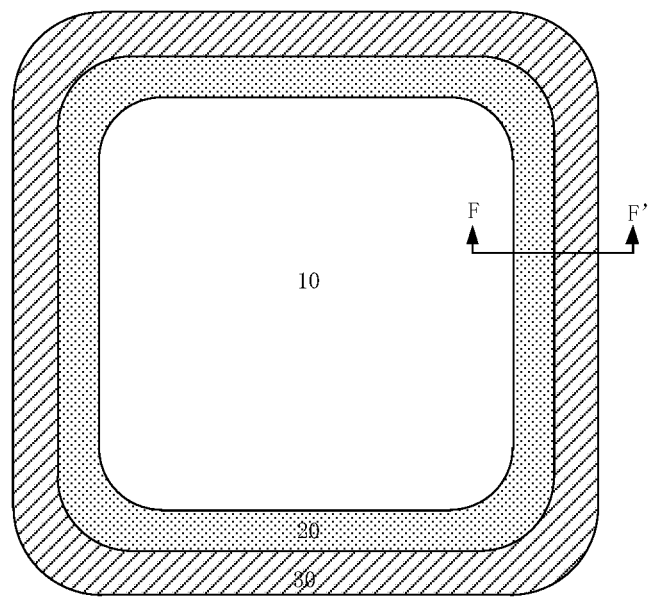
FIG. 1 is a schematic planar structure diagram of a fast recovery diode according to some embodiments.
Figure 10:
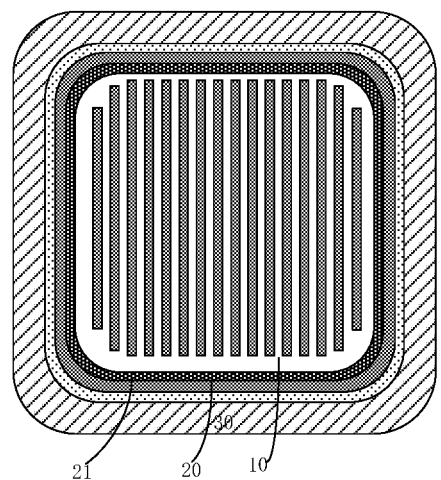
FIG. 10 is a schematic planar structure diagram of a fast recovery diode according to some other embodiments.

According to some embodiments, the cell region includes a PIN structure (as shown in FIG. 1) or an MPS structure (as shown in FIG. 10). Therefore, requirements for different application environments can be met, and the application range can be wider.

Figure 9:
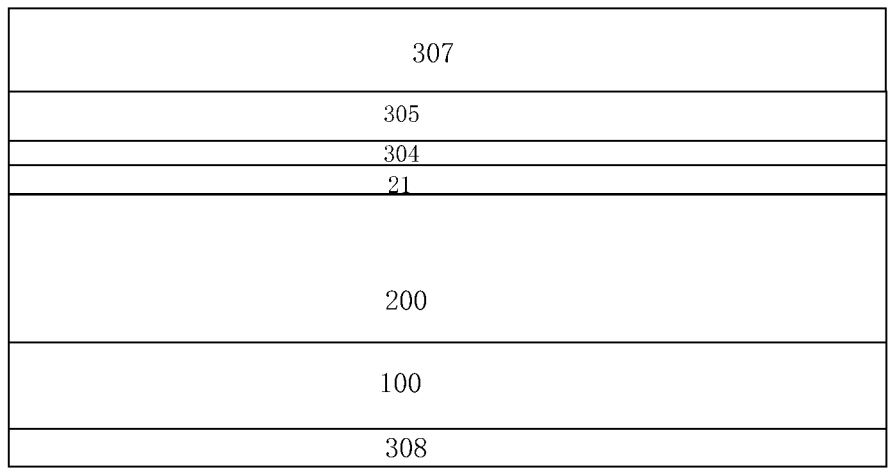
FIG. 9 is a schematic sectional structure diagram of line C-C' in FIG. 4.

According to some embodiments, referring to FIGS. 8 and 9, the fast recovery diode includes: a substrate 100; an epitaxial layer 200 arranged on an upper surface of the substrate 100; a field oxide layer 301 arranged on an upper surface of the epitaxial layer 200 and located in the termination region 30; the plurality of gradient doping regions 21 extending into the epitaxial layer 200 from the upper surface of the epitaxial layer 200; an insulating dielectric layer 304 arranged on upper surfaces of the field oxide layer 301 and the plurality of gradient doping regions 21; an anodic metal 305, arranged on upper surfaces of the insulating dielectric layer 304 and the active region 302 in the cell region 10; a passivation layer 307 arranged on an upper surface of the anodic metal 305; and a back metal 308 arranged on a lower surface of the substrate 100. Certainly, it will be understood by those skilled in the art that the above-described structures are only illustrative of the specific structure of the fast recovery diode, and that other fast recovery diodes with substitutable and adjustable structures fall within the scope without departing from the conception.

It is also to be noted that the schematic planar structure diagrams in the drawings are all schematic planar structure diagrams of the upper surface of the epitaxial layer, that is, the field oxide layer, the insulating dielectric layer, the back metal, and the passivation layer are not shown in the schematic planar structure diagrams. In the schematic sectional structure diagrams in the drawings, only a portion of the cell region adjacent to the main junction region is shown, not the entire cell region. It will be understood by those skilled in the art that doping ions generally diffuse to some extent during the step of forming the gradient doping region, and may diffuse to the termination region or the active region adjacent thereto due to the diffusion effect described above. Therefore, the edge of the gradient doping region shown in the figures may overlap with other regions. For example, the gradient doping region 21 and the field oxide layer 301 in FIG. 8 may overlap. In addition, materials of the substrate and the epitaxial layer, a conductivity type (N-type or P-type), doping ion types of the gradient doping region and the active region, a doping ion concentration, materials of the field oxide layer, the insulating dielectric layer, the anodic metal, the passivation layer, and the back metal, etc. in the fast recovery diode may all be selected according to conventional choices in the art, and no limitation requirements are made here.

Figure 11:
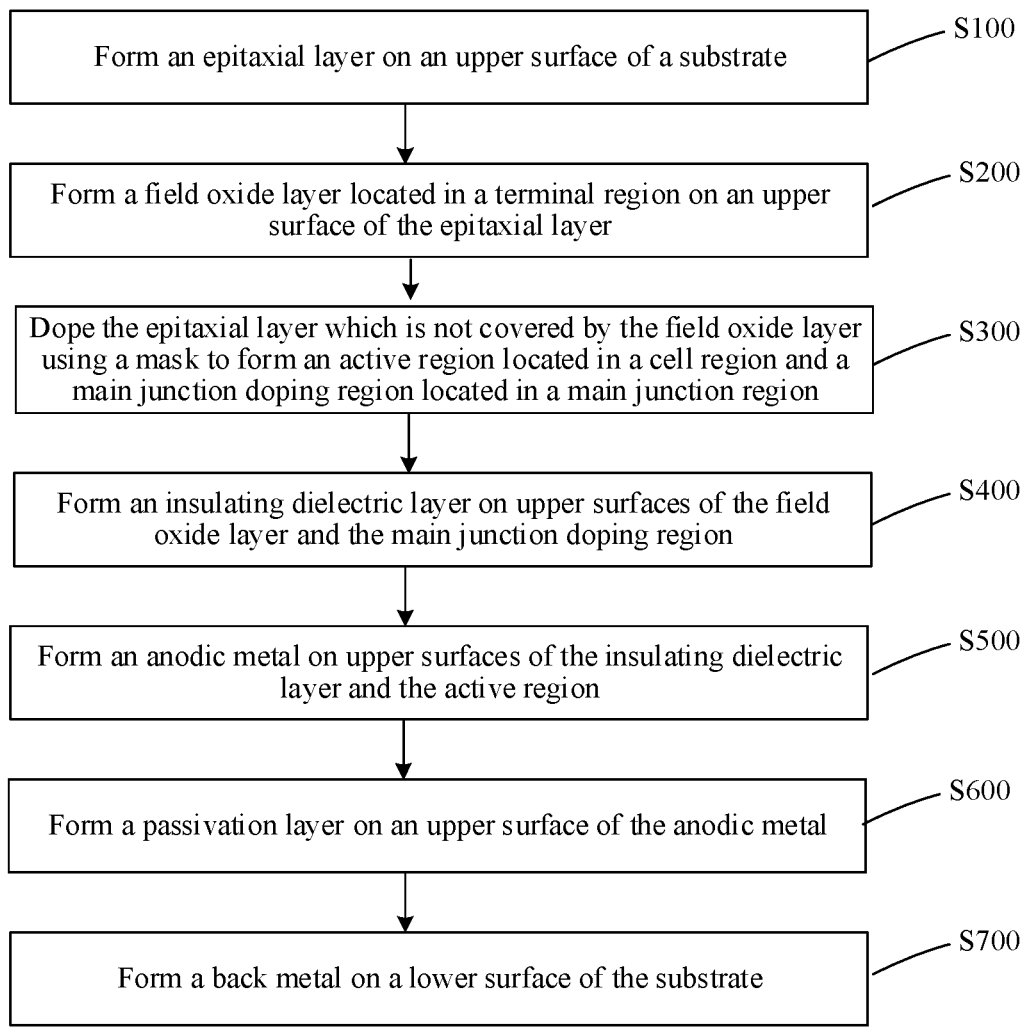
FIG. 11 is a flow diagram of a method for manufacturing a fast recovery diode according to some embodiments.
Figure 12:
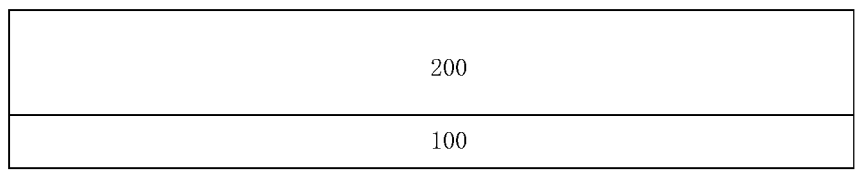
FIG. 12, FIG. 13, FIG. 14, FIG. 15, FIG. 16, FIG. 17, and FIG. 18 are flow diagrams of a method for manufacturing a fast recovery diode according to some embodiments.

In another aspect, a method for manufacturing the fast recovery diode described previously is provided. According to some embodiments, referring to FIG. 11, the method includes:

S100: an epitaxial layer 200 is formed on an upper surface of a substrate 100 (as shown in FIG. 12).

According to some embodiments, materials of the substrate and the epitaxial layer are not particularly limited. For example, the materials of the substrate include, but are not limited to, an N-type silicon substrate, a germanium substrate, a silicon carbide substrate, a gallium nitride substrate, etc., and the materials of the epitaxial layer include, but are not limited to, silicon, germanium, a silicon carbide substrate, gallium nitride, etc.

According to some embodiments, the method for forming an epitaxial layer may be a thermal growth method, a physical vapor deposition method, a chemical vapor deposition method, etc., which may specifically be evaporation, sputtering, etc. Therefore, the process is mature, high in precision, and easy to operate.

Figure 13:
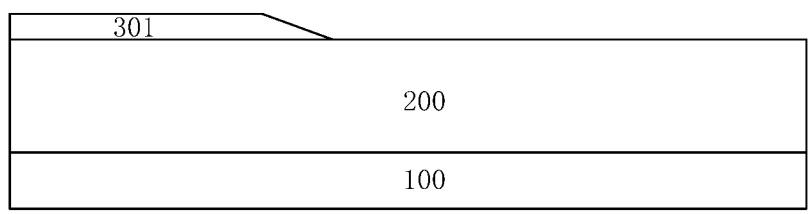

S200: a field oxide layer 301 located in a termination region is formed on an upper surface of the epitaxial layer 200 (as shown in FIG. 13).

According to some embodiments, materials for forming the field oxide layer include, but are not limited to, silicon dioxide. Therefore, the materials are wide in source, easy to obtain, low in cost, and easy to process, and the obtained fast recovery diode has a better using effect.

According to some embodiments, specific steps for forming a field oxide layer may include: forming an oxide layer covering the entire upper surface of the epitaxial layer by a thermal growth method, a physical vapor deposition method or a chemical vapor deposition method, patterning the oxide layer obtained above by using a photomask, i.e., removing the oxide layer in the main junction region and the cell region to obtain a field oxide layer located in the termination region. The specific patterning process may be performed by photoetching, etc., which will not be described in detail herein.

Figure 14:
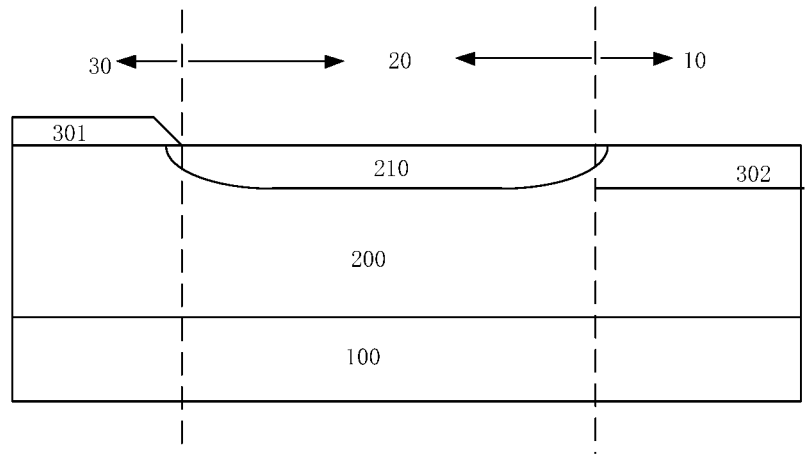

S300: the epitaxial layer 200 which is not covered by the field oxide layer 301 is doped to form an active region 302 located in a cell region 10 and a main junction doping region 210 located in a main junction region 20 (as shown in FIG. 14).

According to some embodiments, the doping may include ion implantation and junction pushing. A specific type of ion implantation and ion implantation dose can be selected by those skilled in the art according to the use requirements and performance of the fast recovery diode. In some embodiments, the type of ions implanted in the present step may be P-type, including but not limited to B or $BF_2$, etc., and the implantation dose may be selected the range of $1E11/cm^2$ to $5E14/cm^2$.

According to some embodiments, since the doping concentrations of the active region in the cell region and the main junction doping region in the main junction region are different, the active region and the main junction doping region may be respectively doped, and meanwhile, the main junction region may also be subjected to low-concentration implantation doping for one or more times according to different doping concentration distribution conditions in the main junction doping region. For example, the epitaxial layer of the cell region may be first doped with a higher implantation dose, then the epitaxial layer of the main junction region may be doped with a lower implantation dose, and the doping may be performed similarly in other cases. Certainly, it can be understood by those skilled in the art that the order of the doping is not particularly limited and may be flexibly adjusted as required, for example, the main junction region may be doped first and then the cell region may be doped.

According to some embodiments, when the main junction doping region includes a plurality of gradient doping regions. In the present step, a photomask with a proper pattern is selected, and the active region and the gradient doping regions may be simultaneously formed by doping once. Therefore, the operation is simple and convenient, the photomask count does not need to be increased, and the cost is greatly reduced.

Figure 19:
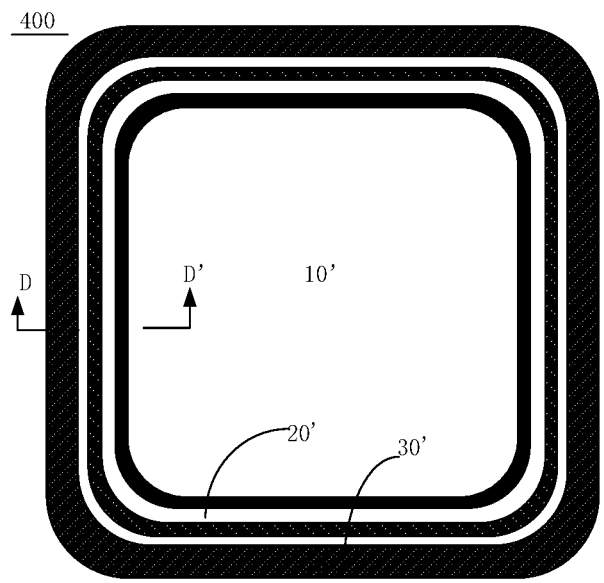
FIG. 19 is a schematic planar structure diagram of a photomask according to some embodiments.
Figure 20:
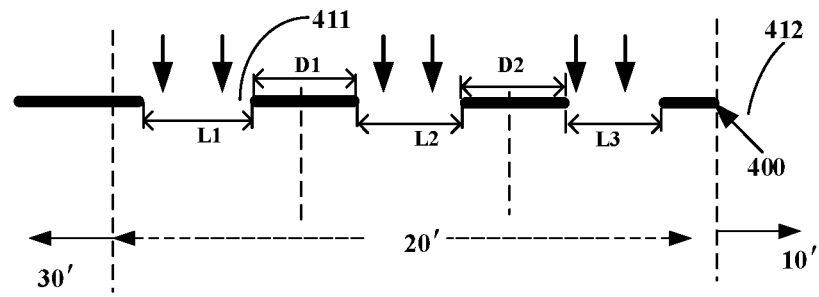
FIG. 20 is a schematic sectional structure diagram of line D-D' in FIG. 19.

According to some embodiments, referring to FIGS. 19 and 20, when the doping is performed by using the same photomask 400 (where a position in the photomask 400 corresponding to the cell region is 10', a position corresponding to the main junction region 20 is 20', and a position corresponding to the termination region 30 is 30'), an active region opening 412 is provided at a position on the photomask 400 corresponding to the active region, the position 20' on the photomask 400 corresponding to the main junction region 20 includes a plurality of annular openings 411 spaced apart from inside to outside, and an area ratio of the annular openings in per unit area of the photomask (i.e., the area of the annular openings or the above unit area) is gradually reduced along a direction from inside to outside. Therefore, the active region corresponds to the opening 412, the main junction region corresponds to the plurality of spaced annular openings, and the positions between the annular openings are shielded by the photomask, so that the amount of doped ions in the main junction region is small, after junction pushing, the doped ions diffuse in the main junction region to form a plurality of gradient doping regions which are continuous, have lower doping concentrations than the active region, and have doping concentrations gradually decreasing from inside to outside.

In some embodiments, referring to FIG. 20, as the area ratio of the annular openings on per unit area of the photomask is larger, there are more doping ions, i.e., the doping concentration of the formed doping region is higher. Therefore, the widths of the annular openings 411 on the photomask and the spacing between two adjacent annular openings may be flexibly adjusted according to the doping concentration of the gradient doping region. The specific adjustment mode is not particularly limited as long as the area ratio of the annular openings in per unit area of the photomask is gradually reduced along a direction from inside to outside. For example, the widths of the plurality of annular openings on the photomask may be equal, i.e. L1=L2=L3, and the spacing between two adjacent annular openings gradually increases, i.e. D2<D1; or, the widths of the plurality of annular openings on the photomask may gradually decrease, i.e. L1<L2<L3, and the spacing between two adjacent annular openings is equal (i.e. D1=D2) or gradually increases (D2<D1). With regard to other different doping concentration distribution situations, those skilled in the art should be able to adjust the shape and size of the openings and the spacing between two adjacent annular openings according to practical requirements, which will not be described in detail herein.

According to some embodiments, one annular opening may correspondingly form one gradient doping region, and a plurality of annular openings may correspondingly form one gradient doping region. In specific situations, flexible selection may be made according to practical requirements. According to some embodiments, the width of each of the annular openings may be 1 to 500 μm, e.g., 1 μm, 5 μm, 10 μm, 50 μm, 100 μm, 150 μm, 200 μm, 250 μm, 300 μm, 350 μm, 400 μm, 450 μm, or 500 μm. In some embodiments, the widths of the annular openings may be 1 to 300 μm. In other specific embodiments, the widths of the annular openings may be 3 to 20 μm, e.g., 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, or 20 μm. Therefore, the active region and the main junction doping region may be simultaneously formed by doping once, the steps are simple and easy to operate, the cost is low, a plurality of gradient doping regions with gradually changing doping concentrations can be effectively formed, and the use performance of the fast recovery diode can be greatly improved.

According to some embodiments, the spacing between two adjacent annular openings may be greater than 0 μm and less than or equal to 6 μm, e.g., 0.1 μm, 1 μm, 2 μm, 3 μm, 4 μm, 5 μm, or 6 μm. Therefore, the gradient doping region with a proper width is obtained favorably, the effect of improving the current crowding effect is better, and the failure rate when an application client device is turned off is low. According to some embodiments, there may be 2 to 25 annular openings (e.g., 2, 3, 4, 5, 6, 7, 8, 9, 10, 11, 12, 13, 14, 15, 16, 17, 18, 19, 20, 21, 22, 23, 24 or 25). Therefore, the charge injection efficiency of the gradient doping region obtained by the photomask is low, the doping effect is good, the current crowding effect is favorably improved, the failure rate when an application client device is turned off is reduced, the chip size is smaller, and the cost is lower.

Figure 21:
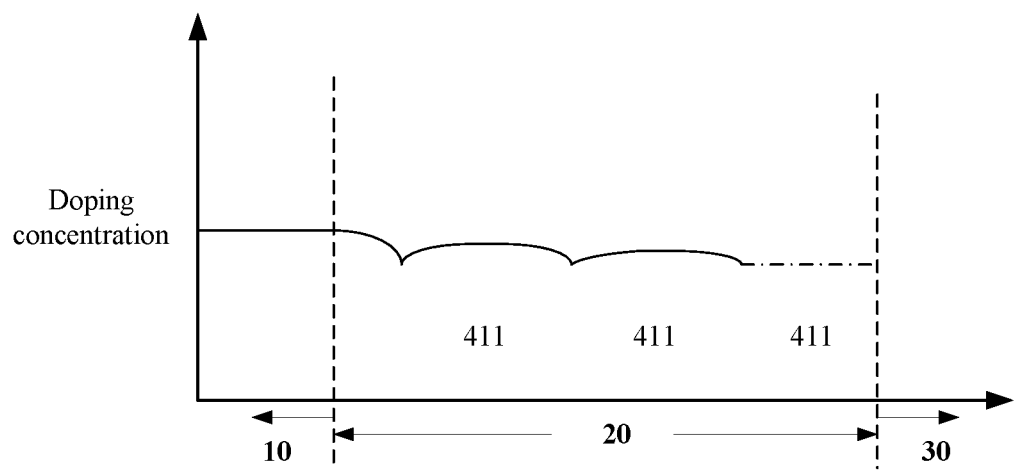
FIG. 21 is a schematic diagram of a doping concentration of a gradient doping region according to some embodiments.

It is to be noted that the gradient doping region formed by the photomask is formed by ion implantation and junction pushing. Since the implanted ions can only be implanted into the epitaxial layer from the annular openings and may diffuse in the junction pushing process, the doping concentrations of the inner and outer sides of the doping region correspondingly formed by each opening is lower than that of the middle part in the actually obtained fast recovery diode, referring to a schematic diagram in FIG. 21.

Figure 15:
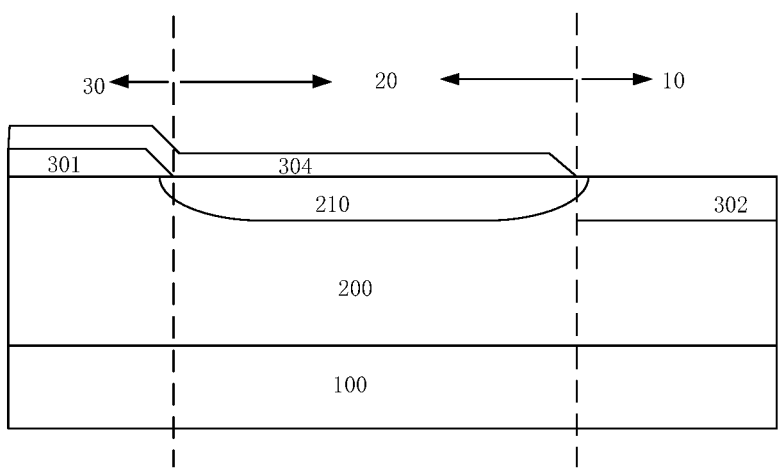

According to some embodiments, the method for obtaining the fast recovery diode with a complete structure may further include the following steps:

S400: an insulating dielectric layer 304 is formed on upper surfaces of the field oxide layer 301 and the main junction doping region 210 (as shown in FIG. 15).

According to some embodiments, materials for forming the insulating dielectric layer include, but are not limited to, silicon dioxide, silicon nitride, etc. Therefore, the insulating dielectric layer has good insulation performance, can play a good protection role, and is wide in material source and low in cost.

According to some embodiments, the present step may adopt a thermal growth method, a physical vapor deposition method, a chemical vapor deposition method, etc., which may specifically be evaporation, sputtering, etc. Therefore, the process is mature, high in precision, and easy to operate.

According to some embodiments, specific steps for forming an insulating dielectric layer may include: forming an insulating layer covering the entire upper surface of the product obtained in the above step by a thermal growth method, a physical vapor deposition method or a chemical vapor deposition method, patterning the insulating layer obtained above by using a photomask, i.e., removing the insulating layer in the cell region to obtain an insulating dielectric layer. The specific patterning process may be performed by photoetching, etc., which will not be described in detail herein.

Figure 16:
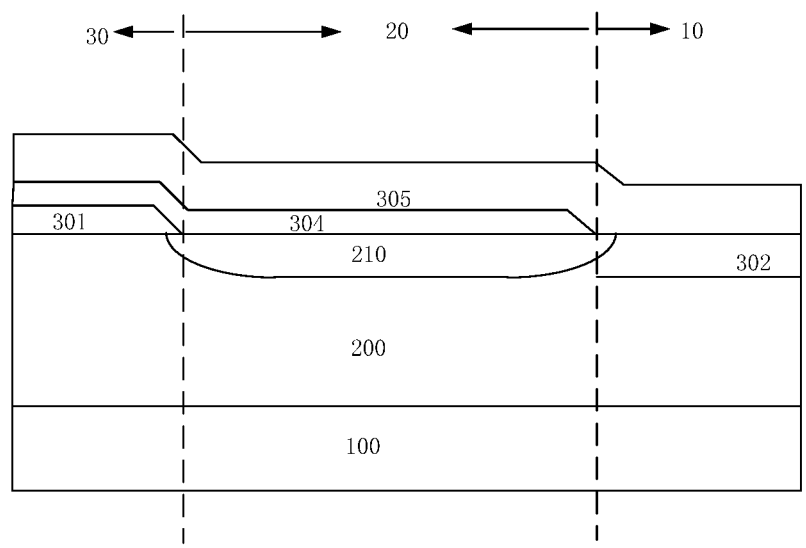

S500: an anodic metal 305 is formed on upper surfaces of the insulating dielectric layer 304 and the active region 302 (as shown in FIG. 16).

According to some embodiments, in the present step, the anodic metal may be formed by electroplating, chemical plating, a physical vapor deposition method, a chemical vapor deposition method, etc., which may specifically be evaporation, sputtering, etc. Therefore, the process is mature, high in precision, and easy to operate. In some embodiments, the anodic metal is in the shape of certain patterns, where an entire metal layer may be formed and then patterned with a photomask having corresponding patterns to obtain the anodic metal.

According to some embodiments, materials for forming the anodic metal include, but are not limited to, gold, silver, copper, etc. Therefore, the anodic metal has good electrical conductivity, and is wide in material source and low in cost.

Figure 17:
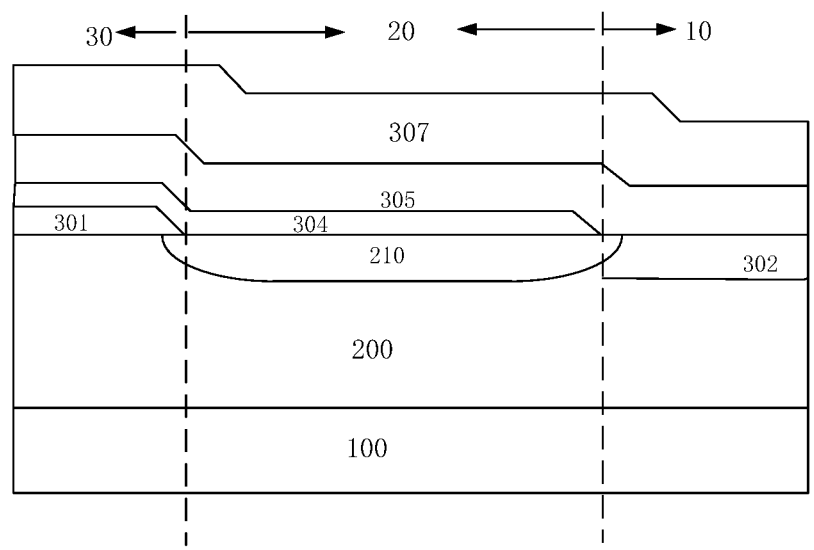

S600: a passivation layer 307 is formed on an upper surface of the anodic metal 305 (as shown in FIG. 17).

According to some embodiments, in the present step, the passivation layer may be formed by a thermal growth method, a physical vapor deposition method, a chemical vapor deposition method, etc., which may specifically be evaporation, sputtering, etc. Therefore, the process is mature, high in precision, and easy to operate. According to some embodiments, materials for forming the passivation layer include, but are not limited to, silicon dioxide, silicon nitride, etc. Therefore, the insulating dielectric layer has good passivation performance, can play a good protection role, and is wide in material source and low in cost.

Figure 18:
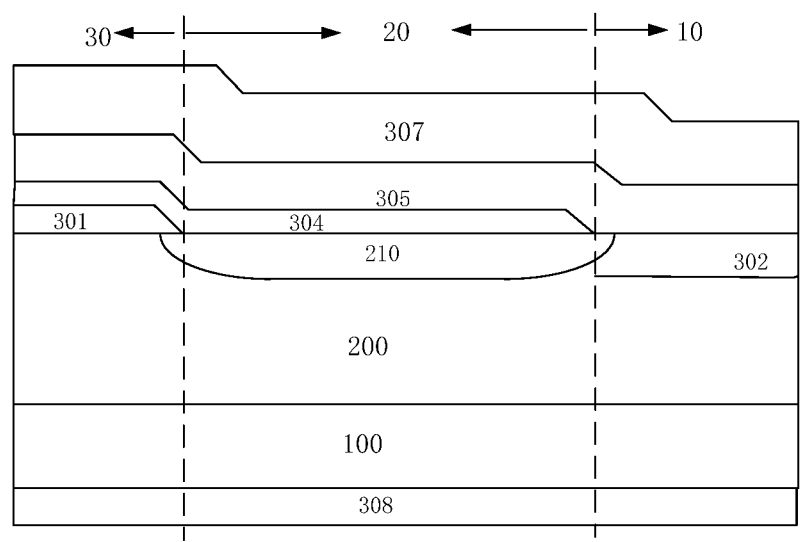

S700: a back metal 308 is formed on a lower surface of the substrate 100 (as shown in FIG. 18).

According to some embodiments, a step of back thinning may also be included as required prior to forming the back metal in the present step. The specific step of thinning may be grinding, polishing and etching (that is, electrochemical etching, wet etching, plasma etching, and combinations thereof), combinations thereof, etc. The back thinning can remove redundant materials on the back, reduce the volume, reduce the thermal resistance, improve the heat dissipation performance, reduce the cracking risk, improve the reliability, and also facilitate improvement of the mechanical performance and electrical performance of the fast recovery diode.

According to some embodiments, in the present step, the back metal may be formed by electroplating, chemical plating, a physical vapor deposition method, a chemical vapor deposition method, etc., which may specifically be evaporation, sputtering, etc. Therefore, the process is mature, high in precision, and easy to operate. In some embodiments, the back metal is in the shape of certain patterns, where an entire metal layer may be formed and then patterned with a photomask having corresponding patterns to obtain the back metal.

According to some embodiments, materials for forming the back metal include, but are not limited to, gold, silver, copper, etc. Therefore, the anodic metal has good electrical conductivity, and is wide in material source and low in cost.

The manufacturing steps for the method for manufacturing a fast recovery diode according to some embodiments are simple and easy to operate, a new photomask does not need to be added for the formation of a first doping region diffusing towards the periphery, and any process cost does not need to be increased.

Some embodiments of the present application are described in detail below.

EMBODIMENTS

Embodiment 1

An epitaxial layer is grown on an upper surface of an n-type silicon substrate, an oxide layer is deposited on an outer surface of the epitaxial layer and then patterned by using a photomask to form a field oxide layer, and then the epitaxial layer is doped for multiple times to sequentially form a main junction doping region and an active region. An insulating layer is deposited on an upper surface of the product obtained above and patterned by using the photomask to form an insulating dielectric layer. An anodic metal is deposited on an upper surface of the product obtained above, a passivation layer is deposited on an upper surface of the anodic metal, and then a back metal is formed on a lower surface of the substrate. FIG. 18 illustrates a schematic sectional structure diagram of an obtained fast recovery diode. As shown in FIG. 18, a doping concentration of the active region is $5e18/cm^3$, and a doping concentration of the main junction doping region is $1e17/cm^3$.

The performance of the obtained fast recovery diode is detected through the following specific detection steps: packaging the fast recovery diode, leading out of an electrode, connecting a sample to a dynamic test circuit, and then sending a control signal for reverse recovery test.

The detection result is that: under the severe condition of up to 3000 A/uS, none of 60 samples failed in an edge main junction region, indicating that the samples have a good effect of resisting current concentration.

Embodiment 2

An epitaxial layer is grown on an upper surface of an N-type silicon substrate, an oxide layer is deposited on an outer surface of the epitaxial layer and then patterned by using a photomask to form a field oxide layer, and then the epitaxial layer is doped by using the photomask to form a main junction doping region and an active region in one step. An insulating layer is deposited on an upper surface of the product obtained above and patterned by using the photomask to form an insulating dielectric layer. An anodic metal is deposited on an upper surface of the product obtained above, a passivation layer is deposited on an upper surface of the anodic metal, and then a back metal is formed on a lower surface of the substrate. FIG. 8 illustrates a schematic sectional structure diagram of an obtained fast recovery diode. As shown in FIG. 8, a doping concentration of the active region is $5e18/cm^3$. 30 annular openings are provided at a position corresponding to the main junction region on the photomask for the doping, and have a width of 5 μm. Three gradient regions are divided, each gradient region corresponds to 10 annular openings, a spacing between two adjacent annular openings in the three gradient regions are respectively 4 μm, 6 μm, and 8 μm from inside to outside, and the obtained concentrations of each gradient region along a direction from inside to outside are about $3e18/cm^3$, $2e18/cm^3$, and $1.5e18/cm^3$ sequentially.

The performance of the obtained fast recovery diode is detected through the following specific detection steps: packaging the fast recovery diode, leading out of an electrode, connecting a sample to a dynamic test circuit, and then sending a control signal for reverse recovery test.

The detection result is that: under the severe condition of up to 3000 A/uS, none of 40 samples failed in an edge main junction region, indicating that the samples have a good effect of resisting current concentration.

Comparative Example 1

In comparison with Embodiment 1, the difference is that the doping concentration of the entire main junction region is the same as that of the active region. The schematic planar structure may be referred to FIG. 1.

The detection result of the present comparative example is that: under the test condition of 3000 A/uS, 4 of 20 samples failed at a main junction edge, indicating that serious current concentration occurred at the main junction edge and the failure rate was high based on this design.

In the description, it is to be understood that the orientations or positional relationships indicated by the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. are the orientations or positional relationships shown in the drawings, are merely to facilitate describing the present disclosure and to simplify the description, are not intended to indicate or imply that the referenced device or element must have a particular orientation, nor to be constructed and operated in a particular orientation, and therefore are not to be construed as limiting the present disclosure.

In addition, the terms "first" and "second" are used for descriptive purposes only and are not to be construed as indicating or implying relative importance or implicitly indicating the number of technical features indicated. Therefore, features defining "first" and "second" may explicitly or implicitly include one or more such features. In the description, the meaning of "plurality" indicates a quantity of two or more unless specifically defined otherwise.

In the present disclosure, unless expressly stated and defined otherwise, the terms "mounting", "connected", "connection", "fixed", etc. are to be construed broadly, for example, as fixed connection, detachable connection or integral connection, as mechanical connection or electrical connection, and as direct connection or indirect connection via an intermediary or communication inside two elements or interaction between two elements. Those of ordinary skill in the art can understand the specific meanings of the above terms in specific situations.

In the present disclosure, unless expressly stated and defined otherwise, a first feature "on" or "beneath" a second feature may be that the first and second features are in direct contact, or that the first and second features are in indirect contact via an intermediary. Moreover, the first feature "over", "above" and "up" the second feature may be that the first feature is directly above or obliquely above the second feature, or simply indicates that a horizontal height of the first feature is higher than that of the second feature. The first feature "under", "below" and "down" the second feature may be that the first feature is directly below or obliquely below the second feature, or simply indicates that a horizontal height of the first feature is less than that of the second feature.

In the description of the present specification, reference to the description of the terms "one embodiment", "some embodiments", "examples", "specific examples", or "some examples", etc. means that specific features, structures, materials, or characteristics described in connection with the embodiment or example are included in at least one embodiment or example. In the present specification, schematic representations of the above terms are not necessarily directed to the same embodiments or examples. Moreover, the specific features, structures, materials, or characteristics described may be combined in any one or more embodiments or examples in a suitable manner. In addition, different embodiments or examples described in the present specification, as well as features of different embodiments or examples, may be integrated and combined by those skilled in the art without conflicting with each other.

While some embodiments have been shown and described above, it is to be understood that the above-described embodiments are illustrative and not to be construed as limiting the present disclosure, and those of ordinary skill in the art may make changes, modifications, substitutions, and variations of the above-described embodiments within the scope of the disclosure.

What is claimed is:

1. A fast recovery diode, comprising:
a cell region;
a main junction region arranged around the cell region; and
a termination region arranged around the main junction region,
wherein a main junction doping region in the main junction region has a doping concentration lower than that of an active region in the cell region, and the doping concentration of the main junction doping region decreases along a direction from inside to outside via a number of gradient doping regions of the main junction doping region,
wherein the number of gradient doping regions are sequentially arranged from inside to outside, each having a doping concentration, and the doping concentration of any gradient doping region is higher than that of an adjacent gradient doping region along the direction from inside to outside,
wherein each of the number of gradient doping regions is an annular continuous region surrounding the cell region, the doping concentration of each gradient doping region is independent from any other doping region by being doped independently and is lower than that of the active region, and the annular gradient doping regions are formed next to each other to form the main junction doping region.

2. The fast recovery diode according to claim 1, wherein the doping concentration of a gradient doping region of the main junction doping region decreases linearly or non-linearly along the direction from inside to outside.

3. The fast recovery diode according to claim 1, wherein a width of each gradient doping region is within a range of 10-200 µm.

4. The fast recovery diode according to claim 1, wherein there are 2 to 25 gradient doping regions.

5. The fast recovery diode according to claim 1, wherein the width of the main junction region is within a range of 20-1000 µm.

6. A fast recovery diode, comprising:
a cell region;
a main junction region arranged around the cell region, the main junction region extending into an epitaxial layer from the upper surface of the epitaxial layer;
a termination region arranged around the main junction region;
a substrate;
an epitaxial layer, arranged on an upper surface of the substrate;
a field oxide layer, arranged on an upper surface of the epitaxial layer and located in the termination region;
an insulating dielectric layer, arranged on upper surfaces of the field oxide layer and the main junction doping region;
an anodic metal, arranged on upper surfaces of the insulating dielectric layer and the active region in the cell region;
a passivation layer, arranged on an upper surface of the anodic metal; and
a back metal, arranged on a lower surface of the substrate,
wherein a main junction doping region in the main junction region has a doping concentration lower than that of an active region in the cell region, and the doping concentration of the main junction doping region decreases along a direction from inside to outside via a number of gradient doping regions of the main junction doping region,
wherein the number of gradient doping regions are sequentially arranged from inside to outside, each having a doping concentration, and the doping concentration of any gradient doping region is higher than that of an adjacent gradient doping region along the direction from inside to outside,
wherein each of the number of gradient doping regions is an annular continuous region surrounding the cell region, the doping concentration of each gradient doping region is independent from any other doping region by being doped independently and is lower than that of the active region, and the annular gradient doping regions are formed next to each other to form the main junction doping region.

7. A method for manufacturing a fast recovery diode, the fast recovery diode comprising a cell region, a main junction region arranged around the cell region, and a termination region arranged around the main junction region, the method comprises:
forming an epitaxial layer on an upper surface of a substrate;

forming a field oxide layer located in a termination region on an upper surface of the epitaxial layer; and doping the epitaxial layer which is not covered by the field oxide layer to form an active region located in a cell region and a main junction doping region located in a main junction region, wherein a main junction doping region in the main junction region has a doping concentration lower than that of an active region in the cell region, and the doping concentration of the main junction doping region decreases along a direction from inside to outside via a number of gradient doping regions of the main junction doping region, wherein the number of gradient doping regions are sequentially arranged from inside to outside, each having a doping concentration, and the doping concentration of any gradient doping region is higher than that of an adjacent gradient doping region along the direction from inside to outside, wherein the doping is performed by using a photomask which provides an active region opening at a position corresponding to the active region, wherein a position on the photomask corresponding to the main junction region comprises a plurality of annular openings spaced apart from inside to outside, and an area ratio of the annular openings to a unit area of photomask is reduced along a direction from inside to outside.

8. The method according to claim 7, wherein the plurality of annular openings have the same width along the direction from inside to outside, and a spacing between two adjacent annular openings increases along the direction from inside to outside.

9. The method according to claim 7, wherein the width of the plurality of annular openings decreases along the direction from inside to outside, and a spacing between two adjacent annular openings is equal or increases along the direction from inside to outside.

10. The method according to claim 7, further comprising:
forming an insulating dielectric layer on upper surfaces of the field oxide layer and the main junction doping region;
forming an anodic metal on upper surfaces of the insulating dielectric layer and the active region;
forming a passivation layer on an upper surface of the anodic metal; and
forming a back metal on a lower surface of the substrate.

* * * * *